United States Patent
Lee et al.

(10) Patent No.: US 6,171,951 B1
(45) Date of Patent: Jan. 9, 2001

(54) DUAL DAMASCENE METHOD COMPRISING ION IMPLANTING TO DENSIFY DIELECTRIC LAYER AND FORMING A HARD MASK LAYER WITH A TAPERED OPENING

(75) Inventors: Tzung-Han Lee, Taipei; Tse-Yi Lu, Chiayi, both of (TW)

(73) Assignee: United Microelectronic Corp., Hsinchu (TW)

( * ) Notice: Under 35 U.S.C. 154(b), the term of this patent shall be extended for 0 days.

(21) Appl. No.: 09/183,530

(22) Filed: Oct. 30, 1998

(51) Int. Cl.[7] .............................................. H01L 21/4763
(52) U.S. Cl. ..................... 438/640; 438/783; 438/618; 438/634; 438/637
(58) Field of Search .................................... 438/618, 620, 438/622, 634, 637, 638, 640, 675, 766, 783

(56) References Cited

U.S. PATENT DOCUMENTS

| | | | | |
|---|---|---|---|---|
| 5,496,776 | * | 3/1996 | Chien et al. ........................ | 438/634 |
| 5,674,784 | * | 10/1997 | Jang et al. ........................... | 438/692 |
| 5,730,835 | * | 3/1998 | Roberts et al. ...................... | 257/773 |
| 5,741,626 | * | 4/1998 | Jain et al. ............................ | 430/314 |
| 5,888,902 | * | 3/1999 | Jun ...................................... | 438/637 |
| 5,904,566 | * | 5/1999 | Tao et al. ............................. | 438/689 |
| 5,972,789 | * | 10/1999 | Jeng et al. ........................... | 438/637 |
| 6,037,664 | * | 3/2000 | Zhao et al. .......................... | 257/758 |

\* cited by examiner

*Primary Examiner*—Carl Whitehead, Jr.
*Assistant Examiner*—Jamie L. Davis

(57) ABSTRACT

A dual damascene manufacturing method includes utilizing a low dielectric constant material to form the dielectric layers and to prevent current due to the reduced line width. An implanting step is performed on the dielectric layers to reduce the incoherence and fragility of the dielectric layers, to densify the dielectric layers and to protect the dielectric layers from damage in the subsequent processes. The present invention utilizes the hard mask layer formed over the dielectric layer to reduce the difficulty of the depositing process of the barrier layer. The openings formed within the hard mask layer are broad at the top and narrow at the bottom. so that the barrier layer is more easily deposited into the opening and the subsequent deposition step of the conductive material layer is easily performed. Moreover, the hard mask layer can be utilized as the etching stop layer in the CMP process.

20 Claims, 4 Drawing Sheets

DUAL DAMASCENE METHOD COMPRISING ION IMPLANTING TO DENSIFY DIELECTRIC LAYER AND FORMING A HARD MASK LAYER WITH A TAPERED OPENING

BACKGROUND OF THE INVENTION

1. Field of Invention

The present invention relates to a method of manufacturing a dual damascene. More particularly, the present invention relates to a method of manufacturing a dual damascene by using low dielectric constant (K) material.

2. Background

FIGS. 1A through 1E are cross-sectional views showing the progression of conventional manufacturing steps in producing a dual damascene.

As shown in FIG. 1A, a substrate structure 100 is provided. For clarity, devices within the substrate structure 100 are not sketched. A defined conductive layer 102 is formed in the substrate structure 100. An oxide layer 104 and a silicon nitride layer 106 aresubsequently formed over the substrate 100 and the conductive layer 102.

As shown in FIG. 1B, the silicon nitride layer 106 is defined by a photolithography method to form an opening exposing the oxide layer 104. Then, an insulation layer 108 is formed over the defined silicon nitride layer 106a and the oxide layer 104 exposed within the opening.

As shown in FIG. 1C, a photoresist pattern (not shown) is used to define the insulation layer 108 by, for example, an anisotropic dry etching method. Using the silicon nitride layer 106a as an etching mask, the oxide layer 104 within the opening is etched away until the conductive layer 102 and the silicon nitride layer 106a are exposed so that trenches 110a and 110b are formed. Trench 110a is formed in the insulation layer 108 (FIG. 1B), silicon nitride layer 106a and oxide layer 104, and exposes the conductive layer 102. Trench 110b is formed in the insulation layer 108 and exposes the silicon nitride layer 106a. The remaining portions of insulation layer 108 are referred to as 108a, 108b and 108c.

As shown in FIG. 1D, a barrier layer 112 is formed over the surface of the trenches 110a and 110b. A metal layer 114 is then formed over the barrier layer 112 and fills the trenches 110a and 110b.

As shown in FIG. 1E, using a chemical mechanical polishing (CMP) method, the redundant portions of metal layer 114 and barrier layer 112 above the insulation layers 108a, 108b and 108c are removed to form via 114a and conductive lines 114b and 114c.

As the size of semiconductor devices is reduced to 0.25 μm, the distance between the conductive line 114b and the conductive line 114c is reduced. Therefore, a capacitor effect will take place on the insulation layer 108b located between the conductive lines 114b and 114c. An additional current is caused by the capacitor effect, hence interfering with the normal operations of the conductive lines 114b and 114c. RC delay and the reduction of the performance of the devices are also caused by the capacitor effect.

Moreover, the decreasing step coverage of the barrier layer 112 accompanies the reduction in width of the trench 110a. Therefore, protruding shapes are formed on the barrier layer 112 at the corners of the trenches 110a and 110b. These protruding shapes obstruct the deposition of the metal layer 114.

SUMMARY OF THE INVENTION

Accordingly, the present invention is to provide an improved dual damascene process for forming dual damascene structure. The dual damascene process is capable of preventing defects, such as the capacitor effect, produced by a conventional dual damascene process.

To achieve these and other advantages and in accordance with the purpose of the invention, a manufacturing method of dual damascene is provided.

The process of the invention comprises the following steps: forming a first dielectric layer over the substrate; forming a hard material layer having a first opening over the first dielectric layer, such that the first opening exposes the first dielectric layer and corresponds to the first conductive layer; forming a second dielectric layer over the hard material layer and covering the exposed first dielectric layer within the first opening; performing a first ion implanting step on the second dielectric layer to densify the second dielectric layer; forming a hard mask layer having a second opening over the second dielectric layer, wherein the second opening is formed corresponding to the first dielectric layer, and the second opening is broad at the top and narrow at the bottom; using the hard mask layer and the hard material layer as etching stop layers to define the second dielectric layer and the first dielectric layer to connect the first opening and the second opening to form a third opening, wherein the third opening exposes the first conductive layer; performing at least a second ion implanting step on the exposed second dielectric layer to densify the second dielectric layer; forming a barrier layer in the third opening; and forming a second conductive layer to fill the third opening, such that the second conductive layer and the second dielectric layer have the same height.

The present invention utilizes a low dielectric constant material to form the dielectric layers and to prevent current due to the reduced line width. An implanting step is then performed on the dielectric layers to reduce the incoherence and fragility of the dielectric layers and to protect the dielectric layers from damage in the subsequent processes.

The present invention utilizes the hard mask layer formed over the dielectric layer to reduce the difficulty of the barrier layer depositing process. The openings formed within the hard mask layer are broad at the top and narrow at the bottom, so that the barrier layer is more easily deposited into the opening and the subsequent deposition step of the conductive material layer is easily performed. Moreover, the hard mask layer can be utilized as the etching stop layer in the CMP process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
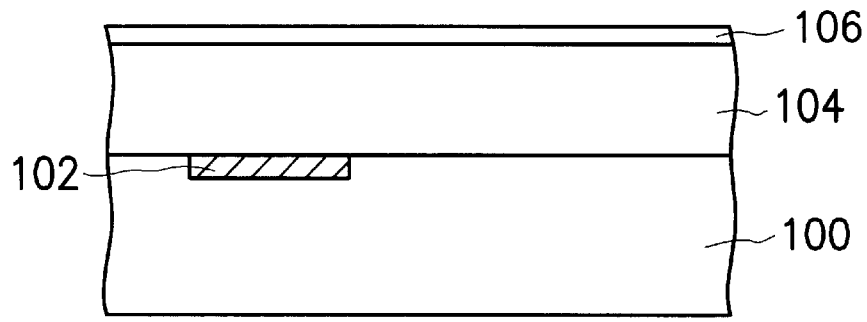
FIGS. 1A through 1E are cross-sectional views showing the progression of conventional manufacturing steps in producing a dual damascene.
Figure 1B:
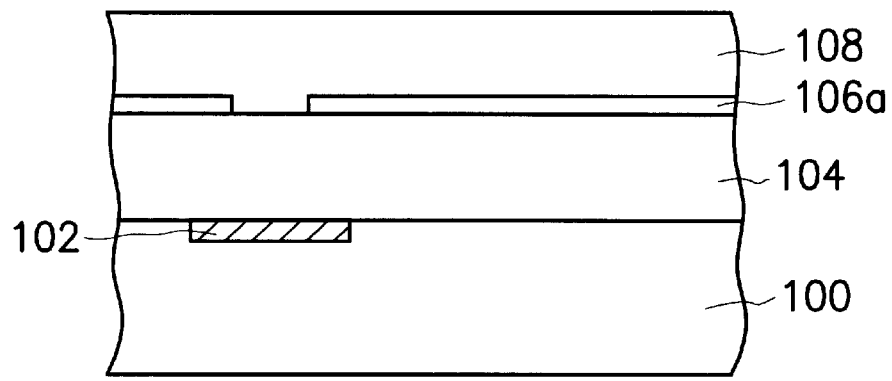
Figure 1C:
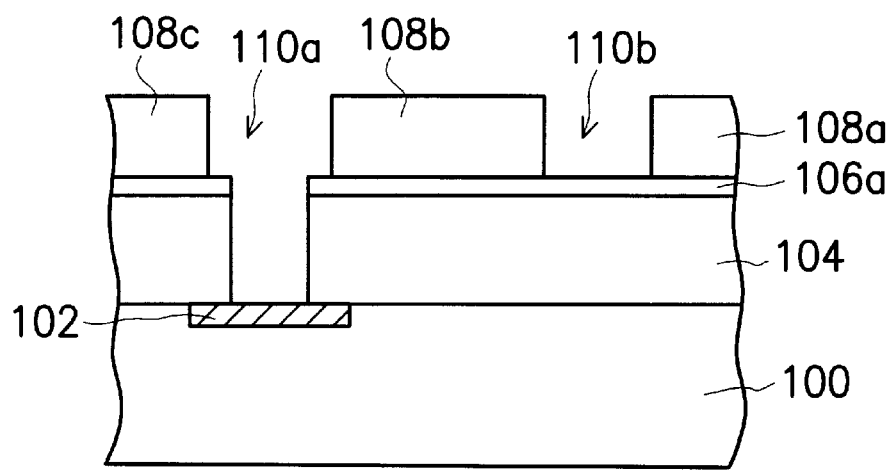
Figure 1D:
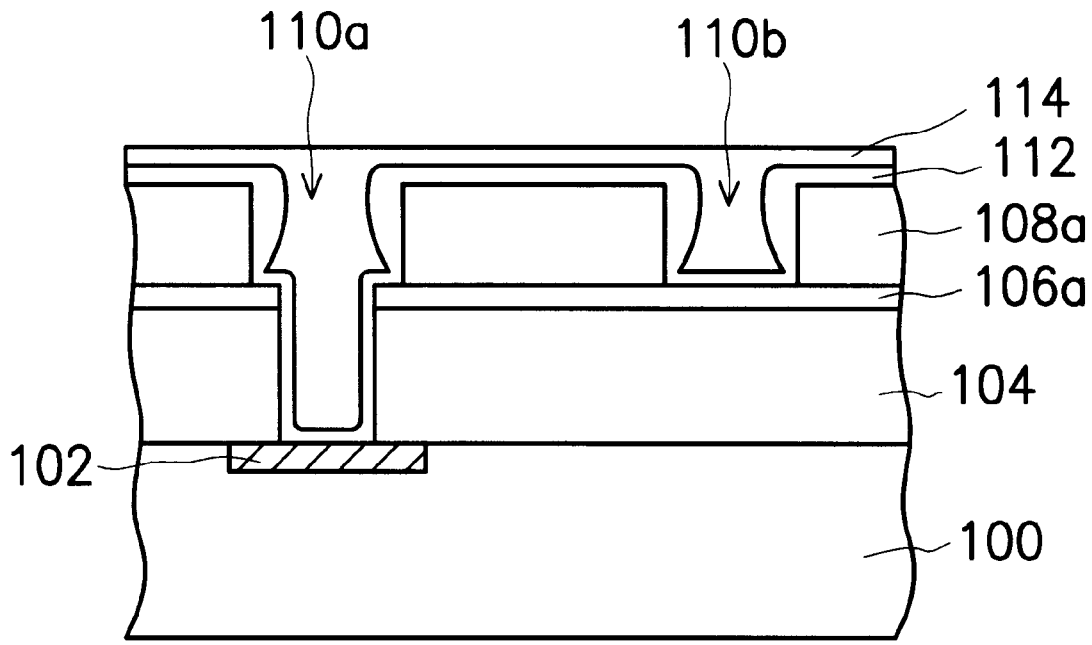
Figure 1E:
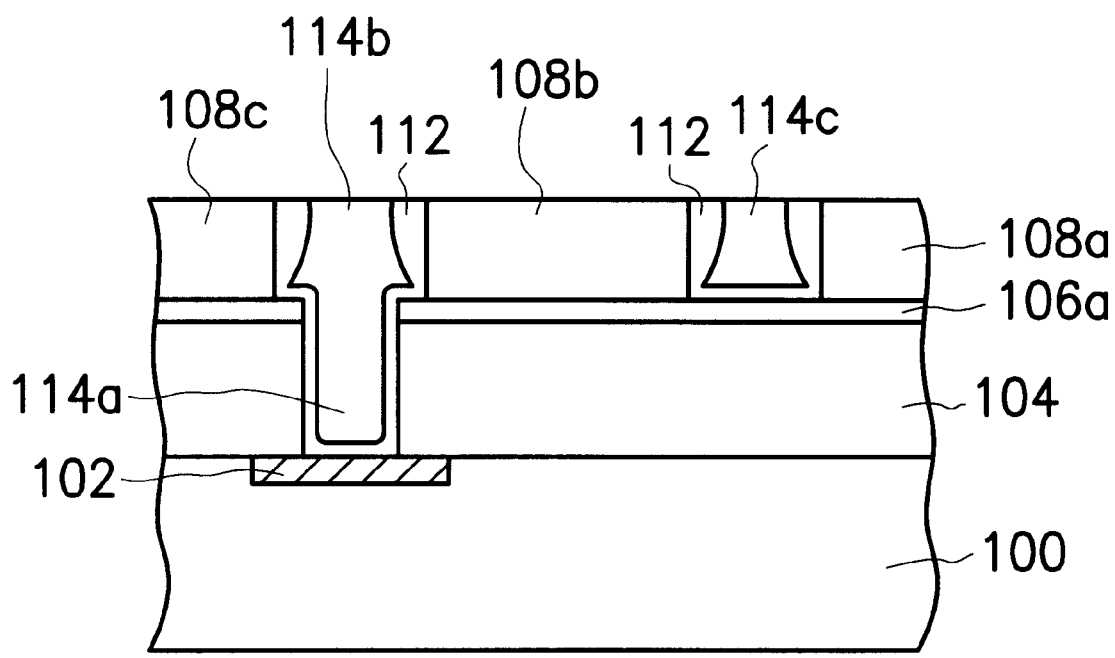

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are cross-sectional views showing the progression of manufacturing steps in producing a dual damascene according to one preferred embodiment of this invention.

Figure 2A:
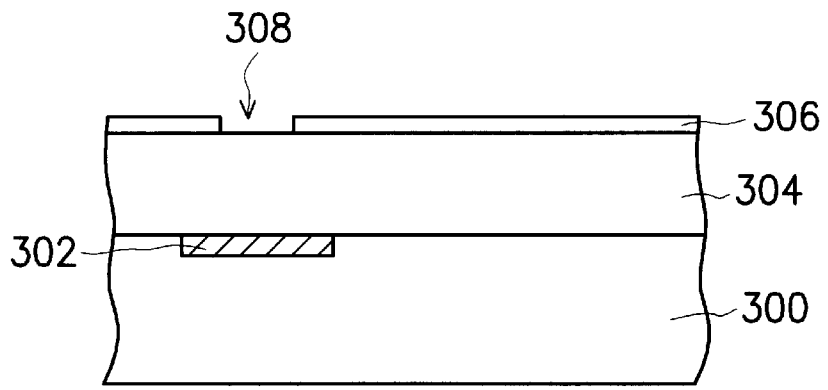
FIGS. 2A through 2F are cross-sectional views showing the progression of manufacturing steps in producing a dual damascene according to one preferred embodiment of this invention.

As shown in FIG. 2A, a substrate structure 300 is provided. For clarity, devices such as MOS transistors within the substrate structure 100 are not sketched. Preferably, the substrate structure 300 is planarized to facilitate the subsequent process. A defined conductive layer 302 is formed in the substrate structure 300. The conductive layer 302 is typically copper, aluminum, or aluminum-copper alloy, although other conductive materials may also be used. Thereafter, a dielectric layer 304 is formed over the conductive layer 302 using, for example, a chemical vapor deposition method or other deposition methods. The dielectric layer 304 is composed of oxide or other low dielectric constant material. A hard material layer 306 having an opening 308 is formed over the dielectric layer 304 with the position of the opening 308 corresponding to the conductive layer 302.

Figure 2B:
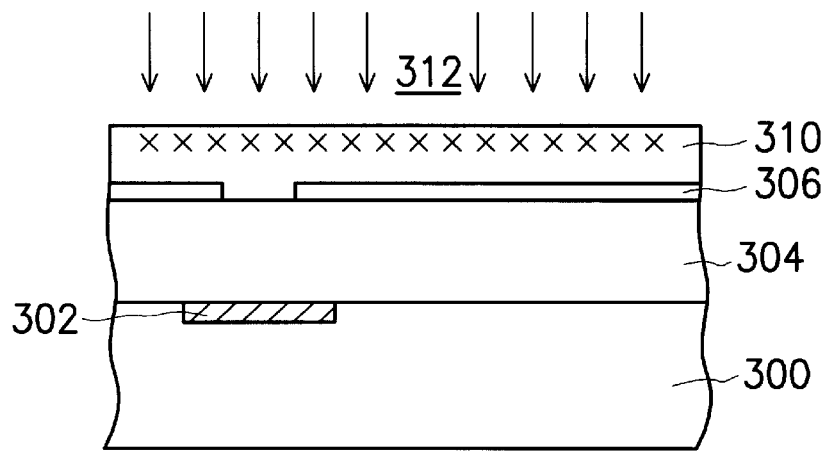

As shown in FIG. 2B, a dielectric layer 310 made from a material having low dielectric constant, for example, field oxide or spin on glass material, is formed over the hard material layer 306. The dielectric layer 310 is preferably composed of a porous material, because of the low dielectric constant of the air. An implanting step is then performed on the dielectric layer 310 to reduce the incoherence and fragility of the dielectric layer 310, to densify the dielectric layer 310 and to protect the dielectric layer from damage in the subsequent processes. The ion implanting step is preferably applied by implanting ions 312, such as As ions or P ions, or by plasma treatment, such as Ar, $N_2$ or $N_2O$ plasma treatment.

Figure 2C:
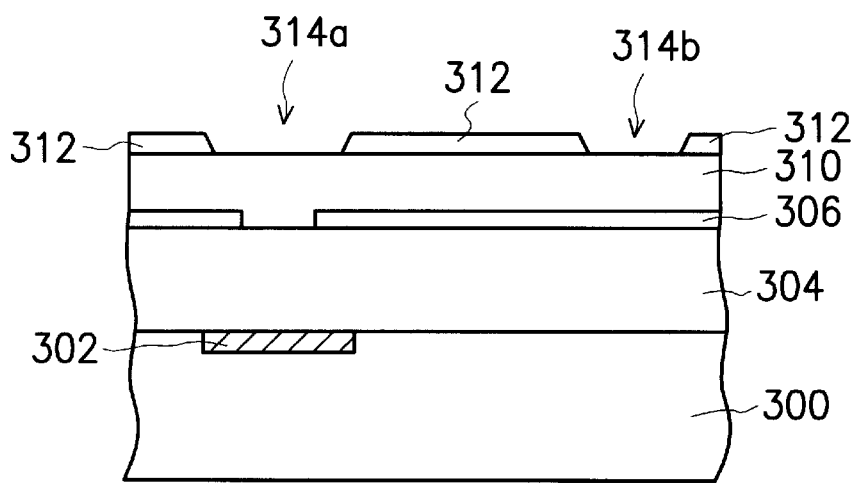

As shown in FIG. 2C, a hard mask layer 312 such as silicon nitride, having openings 314a and 314b, is formed over the dielectric layer 310. The position of the opening 314a corresponds to the conductive layer 302. The openings 314a and 314b within the hard mask layer 312 are broad at the top and narrow at the bottom. The openings 314a and 314b both expose the dielectric layer 310.

Figure 2D:
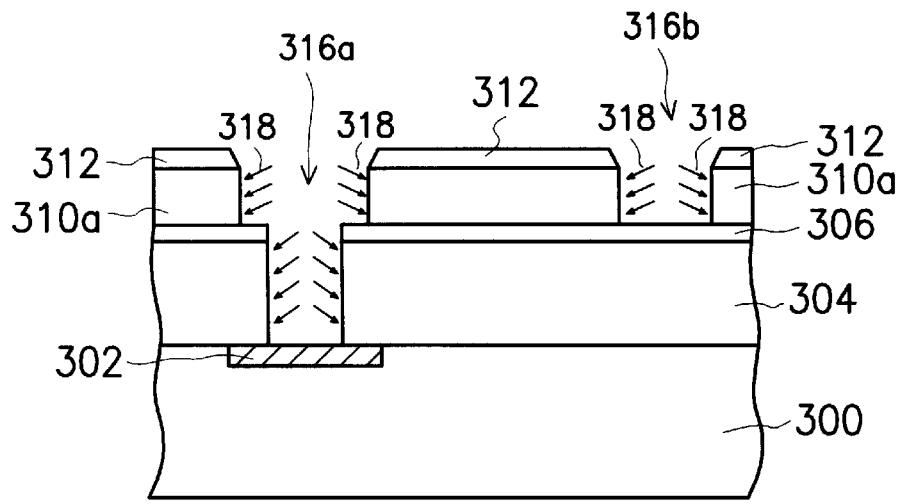

As shown in FIG. 2D, using the hard mask layer 312 and hard material layer 306 as masks, the exposed dielectric layer 310 (FIG. 2C) within the opening 314a and the dielectric layer 304 within the opening 308 (FIG. 2A) are etched away by an etching process to form an opening 316a exposing the conductive layer 302. In the same etching process, the exposed dielectric layer 310 within the opening 314b is etched away to form an opening 316b exposing the hard material layer 306. The sidewall of the opening 316a exposes the dielectric layers 310a and 304. The sidewall of the opening 316b exposes the dielectric layers 310a. An implanting step is then performed on the exposed dielectric layers 310a and 304 to reduce the incoherence and fragility of the dielectric layers 310 and 304, to densify the dielectric layers 310 and 304 and to protect the dielectric layers from damage in the subsequent processes. The ion implanting step is preferably applied by implanting ions 318, such as As ions or P ions, or by low pressure plasma treatment, such as Ar, $N_2$, $N_2O$ or $H_2/O_2$ plasma treatment.

Figure 2E:
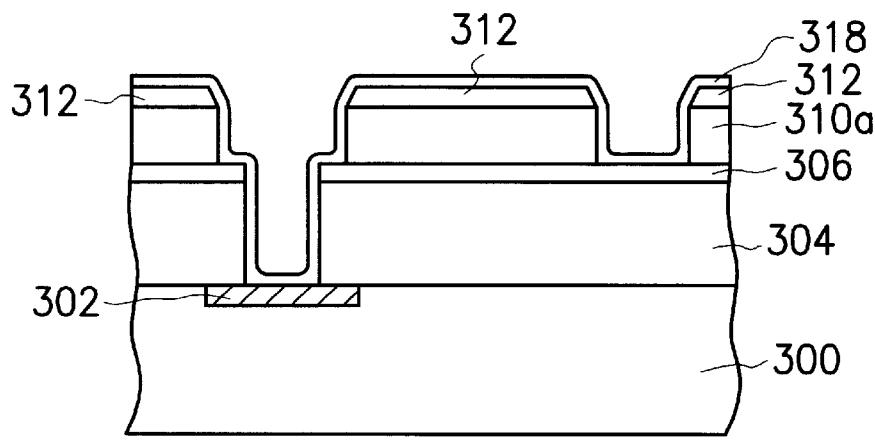

As shown in FIG. 2E, a barrier layer 318 is formed and covers the surfaces of the dielectric layer 310a and 314a exposed in the openings 316a and 316b (FIG. 2D), and over the hard mask layer 312. The barrier layer 318 very easily fills the openings 314a and 314b and covers these exposed surfaces, because the the openings 314a and 314b in hard mask layer 312 are broad at the top and narrow at the bottom. Therefore, the openings 314a and 314b aren't plugged by the barrier layer 318.

Figure 2F:
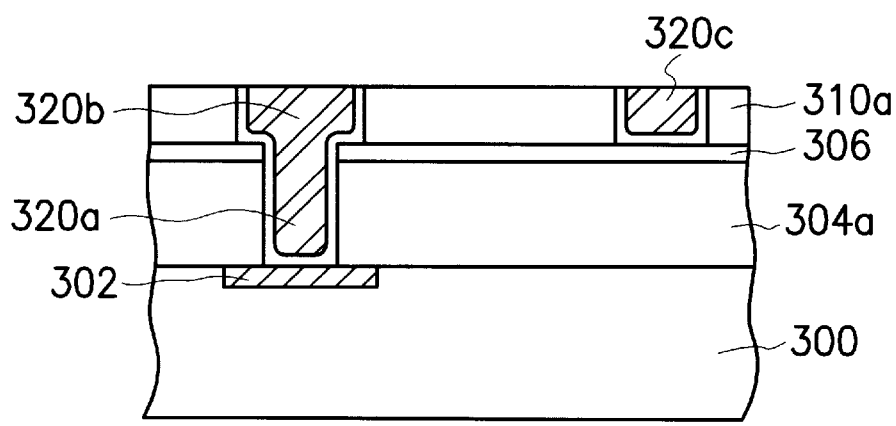

As shown in FIG. 2F, a layer of conductive material is formed over the barrier layer 318 and fills the openings 316a and 316b. A planarization process, for example, a chemical-mechanical polishing (CMP) operation, is performed to planarize and to remove the excessive conductive material layer to form via 320a and conductive line 320b in the opening 316a and to form conductive line 320c in the opening 314b by, for example, using the hard mask layer 312 as an etching stop layer. After the via 320a and conductive lines 320b and 320c are formed, the hard mask layer 312 is then removed. The conductive lines 320b and 320c and the dielectric layer 310a advantageously have the same height t.

The present invention utilizes the low dielectric constant material to form the dielectric layers and to prevent current due to the reduced line width. An implanting step is performed on the dielectric layers to reduce the incoherence and fragility of the dielectric layers, to density the dielectric layers and to prevent the dielectric layers from damaging in the subsequent processes.

The present invention utilizes the hard mask layer formed over the dielectric layer to reduce the difficulty of the depositing process of the barrier layer. The openings formed within the hard mask layer are broad at the top and narrow at the bottom, so that the barrier layer is more easily deposited into the opening and the subsequent deposition step of the conductive material layer is easily performed. Moreover, the hard mask layer can be utilized as the etching stop layer in the CMP process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual damascene manufacturing method suitable for a substrate having a device structure, wherein the substrate has a first conductive layer formed thereon, the process comprising the steps of:

forming a first dielectric layer over the substrate;

forming a hard material layer having a first opening on the first dielectric layer, wherein the first opening exposes the first dielectric layer over the first conductive layer;

forming a second dielectric layer on the hard material layer that covers the exposed first dielectric layer within the first opening;

performing a first ion implanting step on the second dielectric layer;

forming a hard mask layer having at least a second opening on the second dielectric layer, the second opening being aligned over the first conductive layer, wherein the second opening formed within the hard mask layer is broad at the top and narrow at the bottom;

using the hard mask layer and the hard material layer as etching stop layers to etch the second dielectric layer and the first dielectric layer to connect the first opening and the second opening to form a third opening, wherein the third opening exposes the first conductive layer;

performing at least a second ion implanting step on the second and first dielectric layers exposed within the third opening;

forming a barrier layer in the third opening;

forming a second conductive layer to fill the third opening, wherein the second conductive layer and the second dielectric layer have the same height.

2. The method of claim 1, wherein the step of forming the second conductive layer comprises using the hard mask layer as an etching stop point in a CMP step so that the second conductive layer and the second dielectric layer at least have the same height.

3. The method of claim 1, wherein the first ion implanting step comprises using P ions or As ions.

4. The method of claim 1, wherein the second ion implanting step comprises using P ions or As ions.

5. The method of claim 1, wherein the first dielectric layer comprises a low dielectric constant material.

6. A dual damascene manufacturing method suitable for a substrate having a device structure, wherein the substrate has a first conductive layer formed thereon, the process comprising the steps of:

forming a first dielectric layer over the substrate;

forming a hard material layer having a first opening aligned over the first conductive layer on the first dielectric layer, wherein the first opening exposes the first dielectric layer over the first conductive layer;

forming a second dielectric layer over the hard material layer and covering the exposed first dielectric layer within the first opening;

performing a first plasma treatment step on the second dielectric layer;

forming a hard mask layer having a second opening over the first conductive layer on the second dielectric layer, wherein the second opening formed within the hard mask layer is broad at the top and narrow at the bottom;

using the hard mask layer and the hard material layer as etching stop layers to define the second dielectric layer and the first dielectric layer to connect the first and the second opening to form a third opening, wherein the third opening exposes the first conductive layer and the first and the second dielectric layer at the sidewalls thereof;

performing at least a second plasma treatment step on the exposed first and second dielectric layers on the sidewalls of the third opening;

forming a barrier layer in the third opening; and forming a second conductive layer to fill the third opening, such that the second conductive layer and the second dielectric layer have the same height.

7. The method of claim 6, wherein the step of forming the second conductive layer comprises using the hard mask layer as an etching stop point in the CMP step so that the second conductive layer and the second dielectric layer at least have the same height.

8. The method of claim 6, wherein the first plasma treatment step comprises Ar, $N_2$ or $N_2O$ plasma treatment.

9. The method of claim 6, wherein the second plasma treatment step comprises Ar, $N_2$ or $N_2O$ plasma treatment.

10. The method of claim 6, wherein the second plasma treatment step comprises $H_2/O_2$ low pressure plasma treatment.

11. A dual damascene manufacturing method suitable for a substrate having a device structure wherein the substrate has a first conductive layer formed thereon, the process comprising the steps of:

forming a first dielectric layer over the substrate;

forming a hard material layer over the first dielectric layer;

forming a second dielectric layer having low dielectric constant over the hard material layer;

performing a first ion implanting step on the second dielectric layer to densify the second dielectric layer;

forming a hard mask layer having a first opening over the second dielectric layer, wherein the first opening formed within the hard mask layer is broad at the top and narrow at the bottom;

using the hard mask layer as etching stop layer to define the second dielectric layer to form a second opening exposing the hard material layer;

performing a second ion implanting step on the exposed second dielectric layer to densify the second dielectric layer;

forming a barrier layer in the second opening; and forming a second conductive layer to fill the second opening, wherein the second conductive layer and the second dielectric layer have the same height.

12. The method of claim 11, wherein the step of forming the second conductive layer comprises that of using the hard mask layer as an etching stop point in the CMP step so that the second conductive layer and the second dielectric layer at least have the same height.

13. The method of claim 11, wherein the first ion implanting step comprises using P ions or As ions.

14. The method of claim 11, wherein the second ion implanting step comprises using P ions or As ions.

15. The method of claim 11, wherein the first dielectric layer comprises a low dielectric constant material.

16. A dual damascene manufacturing method suitable for a substrate having a device structure, wherein the substrate has a first conductive layer formed thereon, the process comprising the steps of:

forming a first dielectric layer over the substrate;

forming a hard material layer over the first dielectric layer;

forming a second dielectric layer having low dielectric constant over the hard material layer;

performing a first plasma treatment step on the second dielectric layer to densify the second dielectric layer;

forming a hard mask layer having a first opening over the second dielectric layer, such that the first opening formed within the hard mask layer is broad at the top and narrow at the bottom;

using the hard mask layer as etching stop layer to define the second dielectric layer to form a second opening exposing the hard material layer;

performing a second plasma treatment step on the exposed second dielectric layer to densify the second dielectric layer;

forming a barrier layer in the second opening; and forming a second conductive layer to fill the second opening, such that the second conductive layer and the second dielectric layer have the same height.

17. The method of claim 16, wherein the step of forming the second conductive layer comprises using the hard mask layer as an etching stop point in the CMP step so that the second conductive layer and the second dielectric layer at least have the same height.

18. The method of claim 16, wherein the first plasma treatment step comprises Ar, $N_2$ or $N_2O$ plasma treatment.

19. The method of claim 16, wherein the second plasma treatment step comprises Ar, $N_2$ or $N_2O$ plasma treatment.

20. The method of claim 16, wherein the second plasma treatment step comprises $H_2/O_2$ low pressure plasma treatment.

* * * * *